(12) United States Patent
Zeijlon et al.

(10) Patent No.: US 7,923,654 B2
(45) Date of Patent: Apr. 12, 2011

(54) CAPACITIVE TOUCH SWITCH AND DOMESTIC APPLIANCE PROVIDED WITH SUCH SWITCH

(75) Inventors: Anders Zeijlon, Norrkoping (SE); Bjorn Goransson, Soderkoping (SE); Giuseppe Arena, Messina (IT); Roberto Lazzarotto, Castronno (IT); Ettore Arione, Leggiuno (IT)

(73) Assignee: Whirlpool Corporation, Benton Harbor, MI (US)

( * ) Notice: Subject to any disclaimer, the term of this patent is extended or adjusted under 35 U.S.C. 154(b) by 219 days.

(21) Appl. No.: 12/247,289

(22) Filed: Oct. 8, 2008

(65) Prior Publication Data

US 2009/0090611 A1   Apr. 9, 2009

(30) Foreign Application Priority Data

Oct. 8, 2007   (EP) .................................... 07118015

(51) Int. Cl.
*H03K 17/975*   (2006.01)
(52) U.S. Cl. ........................ 200/600; 200/313
(58) Field of Classification Search .................. 200/600, 200/310–314; 345/168, 173, 174; 341/33; 400/479.1
See application file for complete search history.

(56) References Cited

U.S. PATENT DOCUMENTS

| 4,302,647 | A | | 11/1981 | Kandler et al. |
| 4,304,976 | A | * | 12/1981 | Gottbreht et al. ............. 361/280 |
| 5,189,417 | A | * | 2/1993 | Caldwell et al. ................ 341/26 |
| 5,239,152 | A | * | 8/1993 | Caldwell et al. ............. 200/600 |
| 5,607,048 | A | | 3/1997 | Kaizu et al. |
| 6,403,904 | B1 | | 6/2002 | Schilling |
| 6,664,489 | B2 | * | 12/2003 | Kleinhans et al. ............ 200/313 |
| 7,255,466 | B2 | | 8/2007 | Schmidt et al. |
| 7,446,274 | B2 | * | 11/2008 | Choi et al. ..................... 200/314 |
| 2006/0243575 | A1 | | 11/2006 | Cenedese |
| 2008/0143559 | A1 | * | 6/2008 | Dietz et al. ...................... 341/20 |

* cited by examiner

*Primary Examiner* — Felix O Figueroa
(74) *Attorney, Agent, or Firm* — Tara M. Hartman; Diederiks & Whitelaw PLC

(57) ABSTRACT

A capacitive touch switch having a printed circuit board and capacitive electrode provided on a surface of the printed circuit board is disclosed. The printed circuit board is interposed between a transparent planar light guide and the electrode, the planar light guide being attached to a first face of a transparent cover whose second face is adapted to be touched by the user, a light source being connected to the printed circuit board and being able to convey light to the planar light guide.

12 Claims, 3 Drawing Sheets

CAPACITIVE TOUCH SWITCH AND DOMESTIC APPLIANCE PROVIDED WITH SUCH SWITCH

BACKGROUND OF THE INVENTION

1. Field of the Invention

The present invention relates to a capacitive touch switch to be used on control panels of domestic appliance such as cooking ovens, cooking hobs, microwave ovens or the like. The invention particularly refers to a capacitive touch switch comprising a control board and capacitive detecting means provided on a surface of the control board.

2. Description of the Related Art

With the term "switch" we mean every kind of touch sensors which usually replace the traditional buttons in modern flush user interfaces.

Visual feedback activation of a touch switch control is simply provided by a light source, for example a light emitted diode (LED). Usually several touch switches are arranged, together with control board thereof, in a control panel.

To avoid optical interference between adjacent touch switches, light flux shall be conveyed from a light source to the related touch sensitive switch surfaces.

Opaque walls or light guide means are normally provided for this object. The use of opaque walls increases physical dimensions and renders the mounting quite complex.

Light guides can be used as mechanical support for the electrodes. Electrodes can also be made of transparent conductive material (such as indium tin oxide), located between the light guide and the lower surface of the transparent cover under which the touch switch is placed, with an increase of the overall cost of the control panel.

On top of the above illumination problems, there is the need of assuring a good mechanical connection between the touch switch and the transparent cover (usually a glass or plastic plate) under which the switch is placed. Up to now, for assuring such mechanical contact springs or conductive rubber elements have been used, which increase the overall cost and complexity of the single touch switch. Moreover technical solutions are known (for instance from U.S.-A-2006/0243575) in which a support member, carrying electronic components, is separated from the transparent cover by a series of opaque septum-like partitions for creating physically delimited illumination channels. Even if such solution does not require light guides (light emitting diodes are placed on the support member directly), nevertheless it is quite bulky and of complex manufacturing.

SUMMARY OF THE INVENTION

It is an aspect of the present invention to propose a different structural arrangement of a touch switch with a somehow embedded light guide, in order to allow a reduction of physical dimensions of the switch, the use of normal metal electrodes, easy mounting process, and improvement on versatility for different symbols as painted objects.

Another aspect of the present invention is to provide a touch switch that has an improved sensibility.

A further aspect of the present invention is to provide a touch switch that can give a direct feedback to the user when a command has been duly received.

A further aspect of the present invention is to provide a touch switch that is substantially invisible by the user, its presence being detected only when the user's finger touches an enabling switch.

These and further aspects are obtained thanks to the features listed in the appended claims.

The capacitive touch switch according to the present invention is adapted to be used in association with a glass ceramic surface used in cooking appliances. Due to its limited thickness, the touch switch according to the invention does not increase the overall thickness of glass ceramic cooking hobs. Moreover, it is adapted to be used on glass door for cooking ovens and/or microwave ovens where the user interface is integrated in the door itself (and not on a "fixed" user interface usually above the door, as in traditional ovens). This allows the designer to get a very clean and modern design, where the "buttons" are substantially invisible up to when the user decides to switch on the appliance.

BRIEF DESCRIPTION OF THE DRAWINGS

Further features and advantages of the present invention will be clearer from the following description given by way of non-limiting example, with reference to the accompanying drawings, in which.

DETAILED DESCRIPTION OF THE PREFERRED EMBODIMENTS

Figure 1:
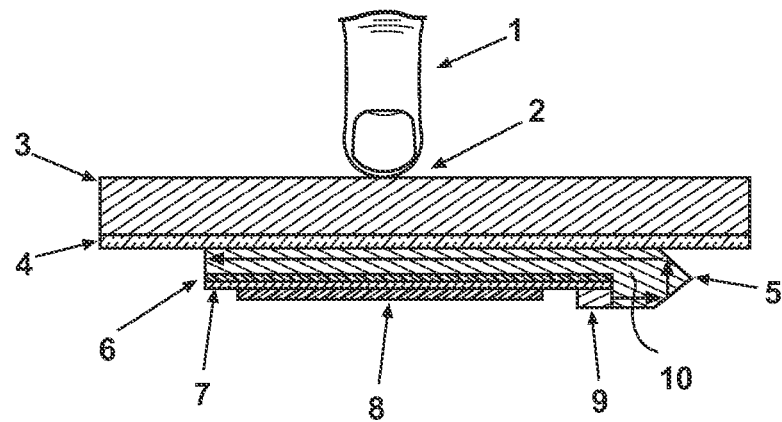
FIG. 1 is a cross section of the touch switch according to a first embodiment of the invention.

With reference to FIG. 1, a structural section for the arrangement of the touch switch and the light guide inside is shown. A planar light guide 5 is located under to the lower surface of the transparent cover 3.

Between light guide 5 and the transparent cover 3 there is a non-conductive layer of transparent paint 4.

A single side printed circuit board (PCB) 7 is attached to the lower side of planar light guide 5 by a no-conductive adhesive layer 6. In this embodiment the PCB is single side, and a capacitive electrode 8 is shown on the lower surface of the PCB. A visual feedback to the user, when his finger 1 touches the sensitive area 2, is given by switching on a led 9 (i.e. when the control board detects valid touch activation). A buzzer (not shown) can generate an acoustic feedback. The led 9 is mechanically and optically coupled to the light guide 5 on an L-shaped edge 5a thereof. Light generated by led 9 is conveyed inside the light guide (indicated by arrows in FIG. 1).

Cuts on light guide or different light conductivity avoids the possibility of light interference between adjacent touch switches. It is worth noting that the planar light guide 5 works also as adjunctive dielectric substrate.

When the function related to the touch switch is OFF, the paint 4 impressed on the non-conductive layer does not result visible to the user through the transparent touch sensitive area.

When the function related to the touch switch is ON, the paint 4 impressed on the non-conductive layer is lighted up by light diffused inside the light guide 5. In this condition, the paint 4 results visible to the user through the transparent touch sensitive area. This is advantageous when the control panel is a unique monochromatic surface when the domestic appliance is switched off. The user interface and the display will light up when the user switches on the appliance or starts using it.

Another possibility with a touch switch according to the present invention is to have a different degree of illumination for each touch switch depending on the actual status thereof. For instance, it is possible to light up certain touch switches with a low level of illumination, while some of them may be lighted up at an higher level of illumination in order to indicate to the user which are the switches which can be actually used. An higher level of illumination can be used also for giving the user an immediate feedback when he touches a switch.

Figure 2:
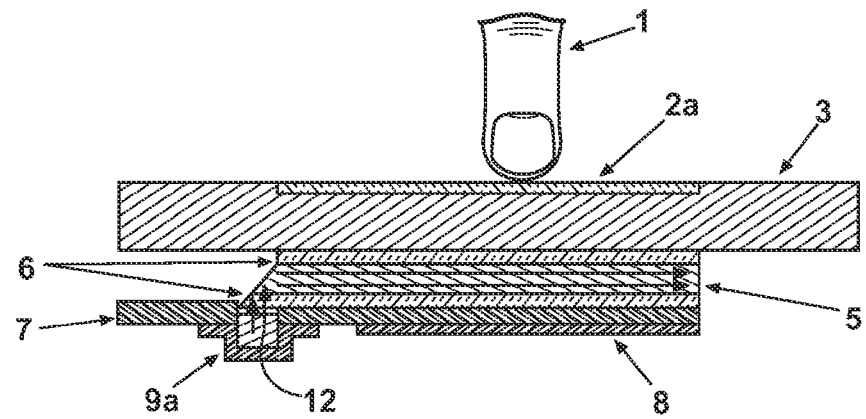
FIG. 2 is a cross section of the touch switch according to a second embodiment of the invention.

FIG. 2, in which similar components have been indicated with the same reference numerals of FIG. 1, relates to a second embodiment of the invention in which an icon serigraphy 2a is placed on the touch sensitive area. A reverse mounted light emitting diode (LED) 9a is placed on an opening or cutout 12 provided in the single side PCB 7, so that light can enter the light guide 5 from the bottom (with reference to an horizontal mounting of the touch switch). When the LED 9a is switched on, the user can detect the shape of the icon 2a (which for instance can indicate a specific function of the appliance).

Figure 3:
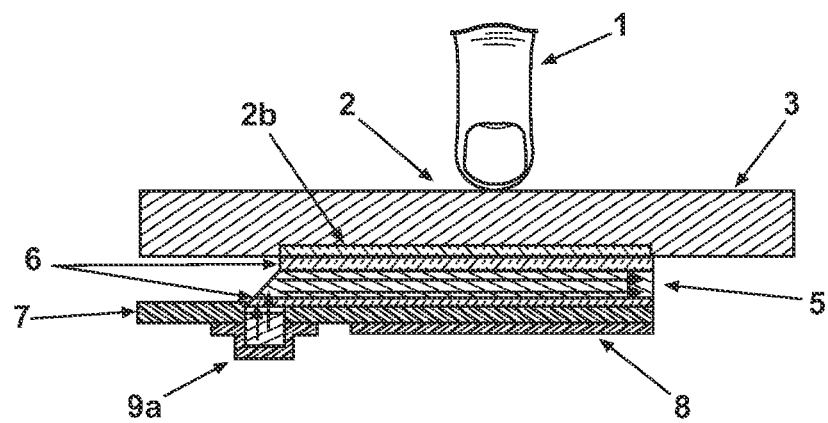
FIG. 3 is a cross section of the touch switch according to a third embodiment of the invention.

A third embodiment is shown in FIG. 3, which differs from the previous embodiment by a different placing of the icon serigraphy 2a that, in this case, is sandwiched between the transparent ceramic glass or plastic cover 3 and the light guide 5 (with the interposition of the adhesive layer 6). Also in this embodiment, as in the one of FIG. 1, a dark effect on the external transparent touch sensitive area is obtained when the switch is off (i.e. not illuminated).

Figure 4:
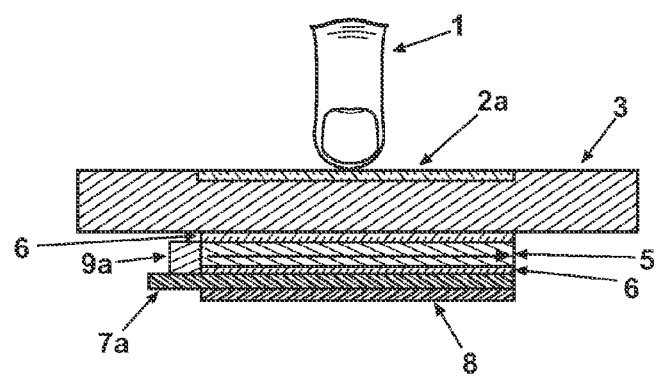
FIG. 4 is a cross section of the touch switch according to a fourth embodiment of the invention.

In the embodiment of FIG. 4 the light emitting diode 9b is fixed to a side of a double side PCB 7a facing the light guide 5. In this embodiment the light from LED 9b is entering an edge of the light guide 5.

Figure 5:
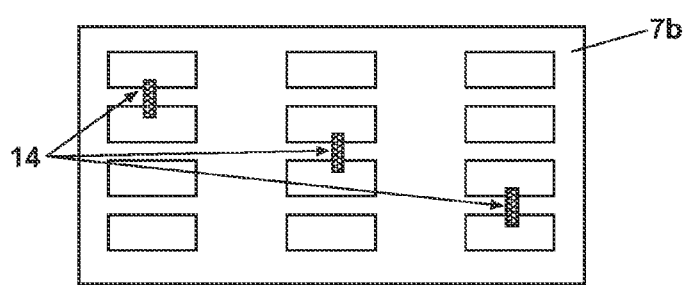
FIG. 5 is a view of a control panel using the touch switches according to the present invention, and showing the possibility to change configuration of the panel.

FIG. 5 relates to a plurality of capacitive touch switches associated to a general printed circuit board 7b where the small pads or electrodes can be connected with soldered bridges or jumpers 14 in order to create a bigger pad from smaller pads. According to traditional technology, several available capacitive touch switches consist of a microcontroller unit having dedicated pins connected to related touch pads. Each pad is in most of the cases just a conductive area shaped as the desired activation area. The most common use is to build the touch system on a PCB where the pad is a copper area. Button position differentiation usually requires different dedicated PCB layouts.

According to this further embodiment of the present invention it is possible to obtain, in a very easy way, a differentiation of the user interface in designing a new product family of domestic appliances. Core of this embodiment is to use a general PCB layout and by populating or not populating a number of 0 ohm resistors (jumpers) so that the board can be configured to obtain different key layouts.

Figure 6:
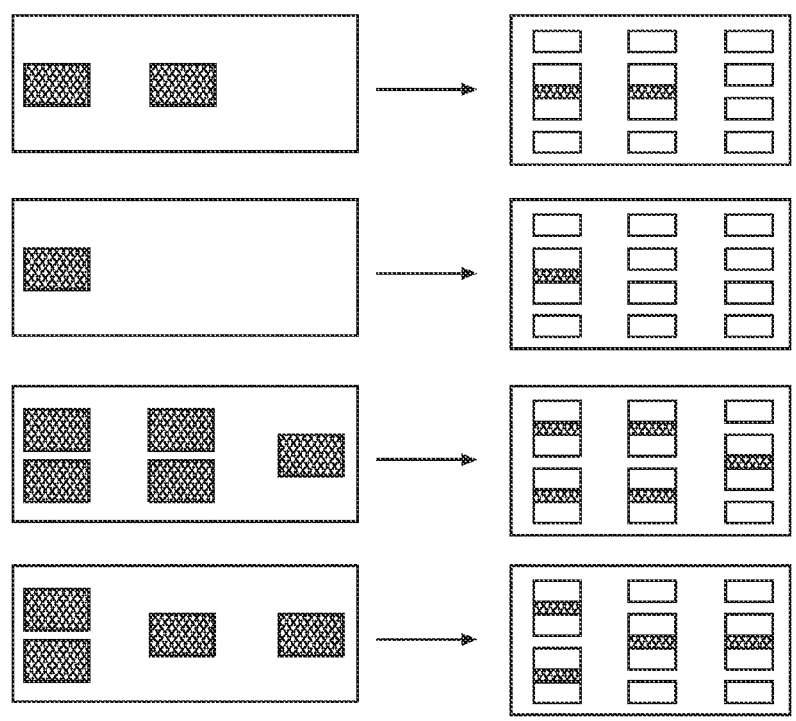
FIG. 6 is a view of four different configurations that can be obtained by starting from the same control panel.

The general board is a matrix of smaller pads, and larger pads are accomplished by connecting two, or more, smaller pads. This is shown for instance in FIG. 6, where on the right side thereof it is shown how the single pads are connected together from a general configuration of PCB and, on the left side thereof, it is shown the overall result in term of four different user interface layouts that, according to the traditional technology, would need four different printed circuit boards.

Figure 7:
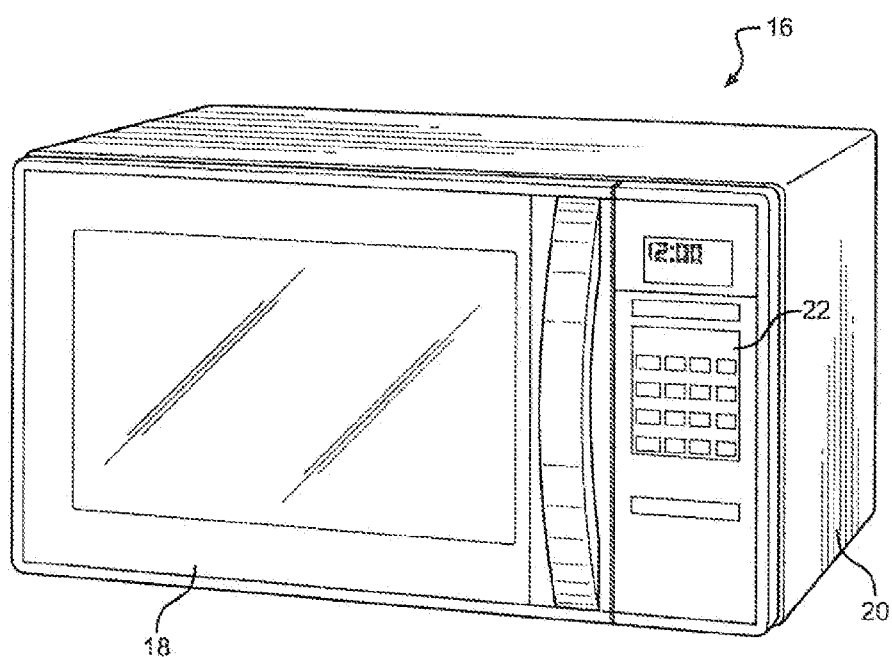
FIG. 7 is a view of an oven including a user interface utilizing the touch switch of the present invention.

In one preferred embodiment, the capacitive touch switch of the present invention can be placed on a cooking appliance. As depicted in FIG. 7, a domestic appliance, particularly a cooking oven 16 or a microwave oven, includes a transparent door 18 hinged to the structure 20 of the oven 16, wherein a user interface 22 with touch switches of the present invention is supported by the door 18.

According to the features described above, with the touch switches according to the invention it is possible to obtain a physical reduction of the dimensions for the backside of the touch switch. Moreover the sensibility of the sensor, since the light guide works also as adjunctive dielectric substrate, is increased. The mounting process is simpler. There is an improvement on versatility for different symbols as painted objects. The use of transparent electrode (for example ITO) is not necessary. No particular arrangement (for example springs, rubber, etc. . . . ) is needed to achieve electrical and mechanical contacts. There is a sharp cost reduction of the overall solution (mechanics, optics and electronics).

We claim:

1. A capacitive touch switch comprising:
   a non-conductive transparent cover including a touch-sensitive area adapted to be touched by a user;
   a planar light guide extending beneath the touch-sensitive area of the non-conductive transparent cover, the planar light guide including an end portion;
   a capacitive electrode provided on a surface of a printed circuit board, the printed circuit board interposed between the planar light guide and the capacitive electrode; and
   a light source connected to the printed circuit board adjacent the end portion of the planar light guide, wherein light generated by the light source is directed into the end portion of the planar light guide and through the planar light guide beneath the touch-sensitive area of the non-conductive transparent cover.

2. The capacitive touch switch according to claim 1, further comprising:
   a non-conductive layer interposed between the planar light guide and the non-conductive transparent cover.

3. The capacitive touch switch according to claim 2, wherein the non-conductive layer is constituted by transparent paint.

4. The capacitive touch switch according to claim 1, wherein the light source is mounted to a face of the printed circuit board opposite the planar light guide and adjacent an L-shaped edge of the planar light guide, wherein the light generated by the light source enters the planar light guide via the L-shaped edge portion before being directed through the planar light guide beneath the touch-sensitive area of the non-conductive transparent cover.

5. The capacitive touch switch according to claim 1, wherein the light source is a reverse mounted light emitting diode installed on a side of the printed circuit board opposite the planar light guide, the printed circuit board being provided with an opening for conveying the light generated by the light source to the end portion of the planar light guide.

6. The capacitive touch switch according to claim 1, further comprising:
   an icon serigraphy on the non-conductive transparent cover.

7. The capacitive touch switch according to claim 1, wherein the light source is provided on a surface of the printed circuit board facing the planar light guide such that the light source is in contact with the end portion of the planar light guide.

8. The capacitive touch switch according to claim 1, wherein the capacitive touch switch is adapted to be electrically bridged to one or more adjacent touch switches in order to change the overall configuration of a control panel.

9. The capacitive touch switch according to claim 1, further comprising, in combination, a domestic appliance including a user interface, said capacitive touch switch being provided on the user interface.

10. A user interface comprising at least one capacitive touch switch including:
- a non-conductive transparent cover including a touch-sensitive area adapted to be touched by a user;
- a planar light guide extending beneath the touch-sensitive area of the non-conductive transparent cover, the planar light guide including an end portion;
- a capacitive electrode provided on a surface of a printed circuit board, the printed circuit board interposed between the planar light guide and the capacitive electrode; and
- a light source connected to the printed circuit board adjacent the end portion of the planar light guide, wherein light generated by the light source enters the planar light guide at the end portion and is directed through the planar light guide beneath the touch-sensitive area of the non-conductive transparent cover.

11. The user interface of claim 10, wherein the at least one capacitive touch switch includes first and second, adjacent capacitive touch switches and the user interface further comprises a jumper connecting the first and second capacitive touch switch to establish a bigger touch pad area for a user.

12. A cooking appliance comprising:
- a door hinged to a structure of the appliance; and
- a user interface supported by the door, the user interface including at least one capacitive touch switch comprising:
    - a non-conductive transparent cover including a touch-sensitive area adapted to be touched by a user;
    - a planar light guide extending beneath the touch-sensitive area of the non-conductive transparent cover, the planar light guide including an end portion;
    - a capacitive electrode provided on a surface of a printed circuit board, the printed circuit board interposed between the planar light guide and the capacitive electrode; and
    - a light source connected to the printed circuit board adjacent the end portion of the planar light guide, wherein light generated by the light source enters the planar light guide at the end portion and is directed through the planar light guide beneath the touch-sensitive area of the non-conductive transparent cover.

* * * * *